United States Patent [19]

Perkins et al.

[11] Patent Number: 5,398,148
[45] Date of Patent: Mar. 14, 1995

[54] PROTECTION CIRCUIT FOR HIGH SIDE DRIVERS

[75] Inventors: Walter R. Perkins, Decator; Randy T. Smith, Huntsville, both of Ala.

[73] Assignee: Chrysler Corporation, Highland Park, Mich.

[21] Appl. No.: 61,979

[22] Filed: May 14, 1993

[51] Int. Cl.6 ............................................. H02H 3/08
[52] U.S. Cl. ............................................. 361/18; 361/91
[58] Field of Search ........................... 361/18, 56, 91

[56] References Cited

U.S. PATENT DOCUMENTS

| | | | |
|---|---|---|---|
| 4,180,026 | 12/1979 | Schulzke et al. | 123/32 EF |
| 4,205,648 | 6/1980 | Graham | 123/139 E |
| 4,266,261 | 5/1981 | Streit et al. | 361/154 |
| 4,477,747 | 10/1984 | Wakai et al. | 315/200 A |
| 4,549,254 | 10/1985 | Kissel | 363/21 |
| 4,631,628 | 12/1986 | Kissel | 361/154 |
| 4,674,460 | 6/1987 | Asmus | 123/470 |
| 4,695,915 | 9/1987 | Mahalek et al. | 361/56 |
| 4,846,129 | 7/1989 | Noble | 123/425 |
| 4,882,532 | 11/1989 | Gariboldi et al. | 361/18 |
| 4,899,256 | 2/1990 | Sway-Tin | 361/386 |
| 4,920,532 | 4/1990 | Wroblewski | 370/85.1 |
| 4,954,917 | 9/1990 | Wirth | 361/98 |
| 5,099,811 | 3/1992 | Frantz et al. | 123/416 |
| 5,151,647 | 9/1992 | Frantz | 322/99 |

OTHER PUBLICATIONS

AN170 NE555 and NE556 Applications, *Signetics*, Feb. 1987.

Automotive Electronics, Cosponsored by The Institute of Electrical and Electronics Engineers, Inc. & The Society of Automotive Engineers, Inc., Feb. 1974, by J. Gyorki.

*Primary Examiner*—A. D. Pellinen
*Assistant Examiner*—Sally C. Medley
*Attorney, Agent, or Firm*—Mark P. Calcaterra

[57] ABSTRACT

A protection circuit for high side drivers is dependent upon load impedance to operate. The protection circuit includes a plurality of transistors and resistors and also a capacitor. The circuit monitors the voltage drop across the emitter-collector junction of a transistor in order to turn the flow of current to the electronic module on or off.

1 Claim, 1 Drawing Sheet

PROTECTION CIRCUIT FOR HIGH SIDE DRIVERS

BACKGROUND OF THE INVENTION

1. Field of the Invention

The present invention relates generally to circuit protectors and, more particularly, to a protection circuit for high side drivers.

2. Description of the Related Art

In today's automotive vehicles, electrical systems commonly include electronic modules. The electronic modules are used to control most operations of the automotive vehicle. For example, the modules can control the door lock and unlock relays, lighting relays, and many other electronic functions.

During production assembly of the automotive vehicles, electrical wires may be pierced, bent, or cut and may be placed within the automotive vehicle. The use of damaged wires or undetected inoperative electronic devices may cause the electronic modules to source currents beyond their ratings, which will cause failure of the electronic modules.

Others in the art have tried to incorporate thermal devices for electronic module protection. The thermal devices monitor the heat given off by certain electrical components and shut down a system if the thermal energy becomes greater than a predetermined value. However, the cost of thermal devices is relatively expensive. Therefore, there is a need in the art for an inexpensive and easy to install electronic module protection device.

SUMMARY OF THE INVENTION

It is, therefore, one object of the present invention to provide a protection circuit for high side drivers.

It is also an object of the present invention to provide a short circuit protection circuit for high side drivers.

It is another object of the present invention to provide a short circuit protection circuit dependent upon load impedance instead of thermal properties.

It is yet another object of the present invention to provide a short circuit protection circuit using standard electrical components instead of costly thermal devices.

To achieve the foregoing objects, the present invention is a protection circuit for high side drivers. The protection circuit includes a level shifter means which is connected to a controller module for interfacing an input signal. The protection circuit also includes a protector means which is connected to the level shifter means and the battery for protecting the controller module from short circuits. The protection circuit also includes an output means connected to the protector circuit for sending a signal to an electrical component.

One advantage of the present invention is that a short circuit protection circuit is provided which is dependent upon the load impedance to operate and not thermal properties. Another advantage of the present invention is that the short circuit protection circuit can be built with standard electrical components at a fraction of the cost of a thermal device.

Other objects, features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
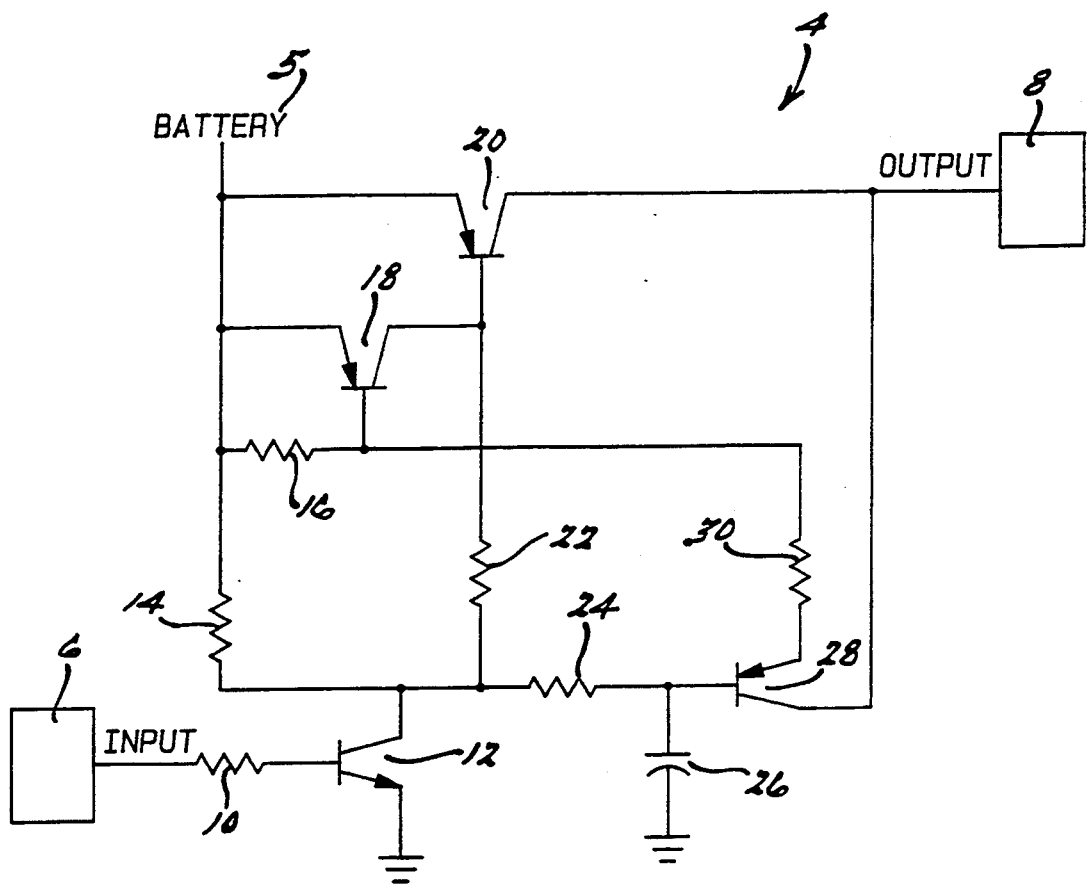
FIG. 1 is a circuit schematic of a protection circuit for high side drivers according to the present invention.

Referring to FIG. 1, a protection circuit 4, according to the present invention, is shown for use on an electronic controller module in an internal combustion engine (not shown). The protection circuit 4 is used to protect against short circuits. The protection circuit 4 is connected between an input 6, output 8 and a vehicle battery 5. The input 6, in our example, is a body controller module known in the art. The protection circuit is connected to the internal microprocessor of the body controller module. It should be appreciated that the protection circuit 4 may be connected to other suitable controller modules. The output 8, in our example, is an automotive vehicle door lock and unlock relay. It should be appreciated that the protection circuit 4 may be connected to other suitable output sources. The protection circuit 4 can be used in any number of vehicle electronic modules including the engine controller module, the body controller module and the timing and control module which are known in the art. It should be appreciated that other electrical systems can be monitored and protected by the protection circuit 4.

The protection circuit 4 includes a level shifter circuit, a protector circuit and an output lead. The level shifter circuit includes a resistor 10 which is connected to the microprocessor of the body controller module. The level shifter circuit also includes a transistor 12 having its base connected to the resistor 10.

The protector circuit includes resistor 14 which is connected between the collector of transistor 12 and the vehicle battery 5. The protector circuit also includes resistor 16 which is connected to the vehicle battery 5. The protector circuit also includes transistor 18 which is connected to the vehicle battery 5 via its emitter and to resistor 16 via its base. The protector circuit also includes transistor 20 which has its emitter connected to the vehicle battery 5 and its base connected to the collector of transistor 18. Transistor 20 also has its collector connected to the output lead which connects to the door lock and unlock relays 8. The protector circuit also includes resistor 22 which is connected between the base of transistor 20 and the collector of transistor 12. The protector circuit also includes resistor 24 which is connected to the collector of transistor 12. The protector circuit also includes transistor 28 which is connected to resistor 24 via its base. The protector circuit also includes a capacitor 26 which is connected to the base of transistor 28 and ground. The protector circuit also includes resistor 30 which is connected between the emitter of transistor 28 and the base of transistor 18. Transistor 28 is also connected via its collector to the output lead which connects to the door lock and unlock relays 8.

In operation, the protection circuit 4 relies on the voltage drop across the emitter-collector junction of the transistor 20 to operate. During normal operating conditions, an input signal received from the microprocessor in the body control module is interfaced into the protection circuit 4 via the level shifter circuit. The input signal works in conjunction with the vehicle battery current to control the door lock and unlock relays. Under normal operating conditions the voltage drop across the emitter-collector junction of transistor 20 will be small. However, when the protection circuit 4 is driving a short circuit this will cause transistor 20 to no longer be in a saturated state. Therefore, a large voltage drop will appear across the emitter-collector junction of transistor 20. The large voltage drop across the emitter-collector junction of transistor 20 will be sensed by transistor 28. Transistor 28 will then release a current which will turn transistor 18 on. Transistor 18 will then short out the base emitter junction of transistor 20 which in effect will turn transistor 20 off. Thus, transistor 20 is protected from a source current which in turn protects the controller module and door lock and unlock relays.

The protection circuit 4 allows a person skilled in the art to select a time duration for driving a low impedance load. This will allow for lamp loads which have a low impedance turn-on and a moderate steady-state current to be monitored and protected. The time delay will also prevent false protection shut-downs from occurring.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A protection circuit for high side drivers for use in an internal combustion engine controller module, said protection circuit being connected to a vehicle battery and comprising:

a level shifter circuit which is connected to the controller module for interfacing an input signal from the controller module, said level shifter circuit including a first resistor connected to the controller module and a first transistor having a base connected to said first resistor;

a protector circuit connected to said level shifter circuit and the battery for protecting the controller module from short circuits, said protector circuit including a second resistor connected between a collector of said first transistor and the battery, a third resistor connected to the battery, a second transistor having an emitter connected to the battery and a base connected to said third resistor, a third transistor having an emitter connected to the battery and a base connected to a collector of said second transistor, a fourth resistor connected between the base of said third transistor and the collector of said first transistor, a fifth resistor connected to the collector of said first transistor, a fourth transistor having a base connected to said fifth resistor, a capacitor connected to the base of said fourth transistor, and a sixth resistor connected between an emitter of said fourth transistor and the base of said second transistor; and an output lead connected to a collector of said third transistor and a collector of said fourth transistor of said protector circuit for sending a signal to a predetermined electrical component.

* * * * *